United States Patent [19]

Egawa

[11] Patent Number: 5,151,615

[45] Date of Patent: Sep. 29, 1992

[54] NOISE ABSORBING CIRCUIT SUITABLE FOR SEMICONDUCTOR INTEGRATED CIRCUITS

[75] Inventor: Noboru Egawa, Tokyo, Japan

[73] Assignee: Oki Electric Industry Co., Ltd., Tokyo, Japan

[21] Appl. No.: 725,532

[22] Filed: Jul. 3, 1991

[30] Foreign Application Priority Data

Jul. 13, 1990 [JP] Japan ................... 2-185766

[51] Int. Cl.$^5$ ............................. H03K 19/00
[52] U.S. Cl. .................................. 307/443
[58] Field of Search ................... 307/443, 475, 440

[56] References Cited

U.S. PATENT DOCUMENTS 4,864,164 9/1989 Ohshima et al. ............. 307/443
4,947,063 8/1990 O'Shaughnessy et al. .......... 307/443
5,059,822 10/1991 Dukes ....................... 307/443

Primary Examiner—Robert J. Pascal
Attorney, Agent, or Firm—Edward D. Manzo; John J. King

[57] ABSTRACT

A semiconductor integrated noise absorbing circuit comprising an output variation detecting circuit for detecting such a condition that the output signal level of an output buffer circuit changes from a high level to a low level, an input level detecting circuit for detecting such a condition that a voltage level in high level of an input signal line, a capacitor connected to the input signal line, and a gate circuit connected between the load capacitor and the signal line, the gate circuit being closed so as to connect the capacitor to the input signal line if the voltage level of the input signal line is high when the output level of the output buffer circuit changes from a high level to a low level.

18 Claims, 2 Drawing Sheets

NOISE ABSORBING CIRCUIT SUITABLE FOR SEMICONDUCTOR INTEGRATED CIRCUITS

REFERENCE TO RELATED APPLICATIONS

This invention claims the right of priority under 35 U.S.C. 119, of Japanese Patent Application Serial No. 02-185766, filed on Jul. 13, 1990.

BACKGROUND OF INVENTION

1. Field of the Invention

The present invention relates to a semiconductor integrated noise absorbing circuit, in particular to a circuit for protecting an input signal against output noise from a semiconductor integrated circuit.

2. Description of the Related Art

Semiconductor integrated circuits incorporating a noise absorbing circuit have been conventionally known. For example, Japanese Laid-Open Patent No. 63-52513 Publication discloses a semiconductor integrated circuit which detects a change in the output of an output buffer circuit from a high logic level "H" to a low logic level "L" and interrupts to supply an input signal to the internal circuits for a period until a ground (GND) line becomes stable. Such an interruption prevent malfunction of the internal circuits caused by an undesirable potential rise produced on a power source line. FIG. 2 shows one example of a conventional circuit which prevents malfunction caused by voltage noise. That is, in the circuit shown in FIG. 2, incorporating output buffer circuits $DO_l$ to $DO_n$ and input buffer circuits $DI_l$ to $DI_m$ which are connected commonly to a GND line, output change detecting circuits $SEN_l$ to $SEN_n$ respectively detect a change in output level of the output buffer circuits $DO_l$ to $DO_n$ from "H" to "L".

When any one of the output buffer circuits changes its output level to "L", an operation control signal $\phi_l$ delivered from an AND gate circuit AND is forcibly turned into "L" during a delayed period caused by the respective inverters in the detecting circuits $SEN_l$–$SEN_n$. Then, all clocked inverter circuits $CIV_l$ to $CIV_n$ are held in a high impedance condition. As a result, the operation of signal supply from the input buffer circuits to the internal circuits is temporarily ceased during the delayed period. As a result, it is possible to prevent malfunction of the internal circuits when an undesirable potential rise caused by a change in level of an output signal from any one of the output buffer circuits occurs on the ground line.

However, the above-mentioned conventional circuit requires a circuit for holding an internal signal at a certain level during a period in which the operation of signal supply to the internal circuits is interrupted. Accordingly the circuit arrangement is complicated and large in scale. Further, since the above-mentioned noise causes a problem only at such a period when an input level "H" is erroneously determined to be "L", the protection of an input signal against the noise becomes meaningless at such a period when the input level is "L". However, the above-mentioned circuit interrupts the operation of signal supply to the internal circuits whenever an output from any one of the output buffer circuits changes from "H" to "L", irrespective of the condition of an input signal. Accordingly, the input signal is always delayed. Thus, the conventional circuit has disadvantages.

BRIEF SUMMARY OF THE INVENTION

The present invention is devised in view of the above-mentioned problems inherent to the conventional arrangements. Accordingly, one object of the present invention is to provide a noise absorbing circuit which can prevent an internal circuit from malfunctioning due to noise, while reducing a delay of an input signal.

According to the present invention, a noise absorbing circuit suitable for a semiconductor integrated circuit comprises an output variation detecting circuit for detecting such a condition that the output level of an output buffer circuit changes from a high level "H" to a low level "L"; an input level detecting circuit for detecting such a condition that an input signal line has a high voltage level; a capacitor connected to the input signal line; and a gate circuit connected between the load capacitor and the input signal line, the gate circuit being closed so as to connect the capacitor to the input signal line if the voltage level of the input signal line is high when the output level of the output buffer circuit changes from a high level to a low level.

Accordingly, since the input signal line is connected to the capacitor which receives and absorbs noise produced on this input line, it is possible to prevent the input signal from being erroneously read due to the produced noise. Further, if the voltage level of an input signal is low, the above-mentioned signal line is isolated from the above-mentioned load capacitor. Accordingly, it is possible to prevent the input signal transmission rate from being lowered when the input signal is low.

The further scope and applicability of the present invention will become apparent from the detailed description and specific example, while the preferred embodiments of the invention are given by way of illustration only, since various changes and modifications within the spirit and scope of the invention will become apparent to those skilled in the art from this detailed description.

BRIEF DESCRIPTION OF THE DRAWINGS

These and other features and advantages of the invention may be more completely understood from the following detailed description of the preferred embodiments of the invention with reference to the accompanying drawings in which.

DESCRIPTION OF THE PREFERRED EMBODIMENTS

Figure 1:
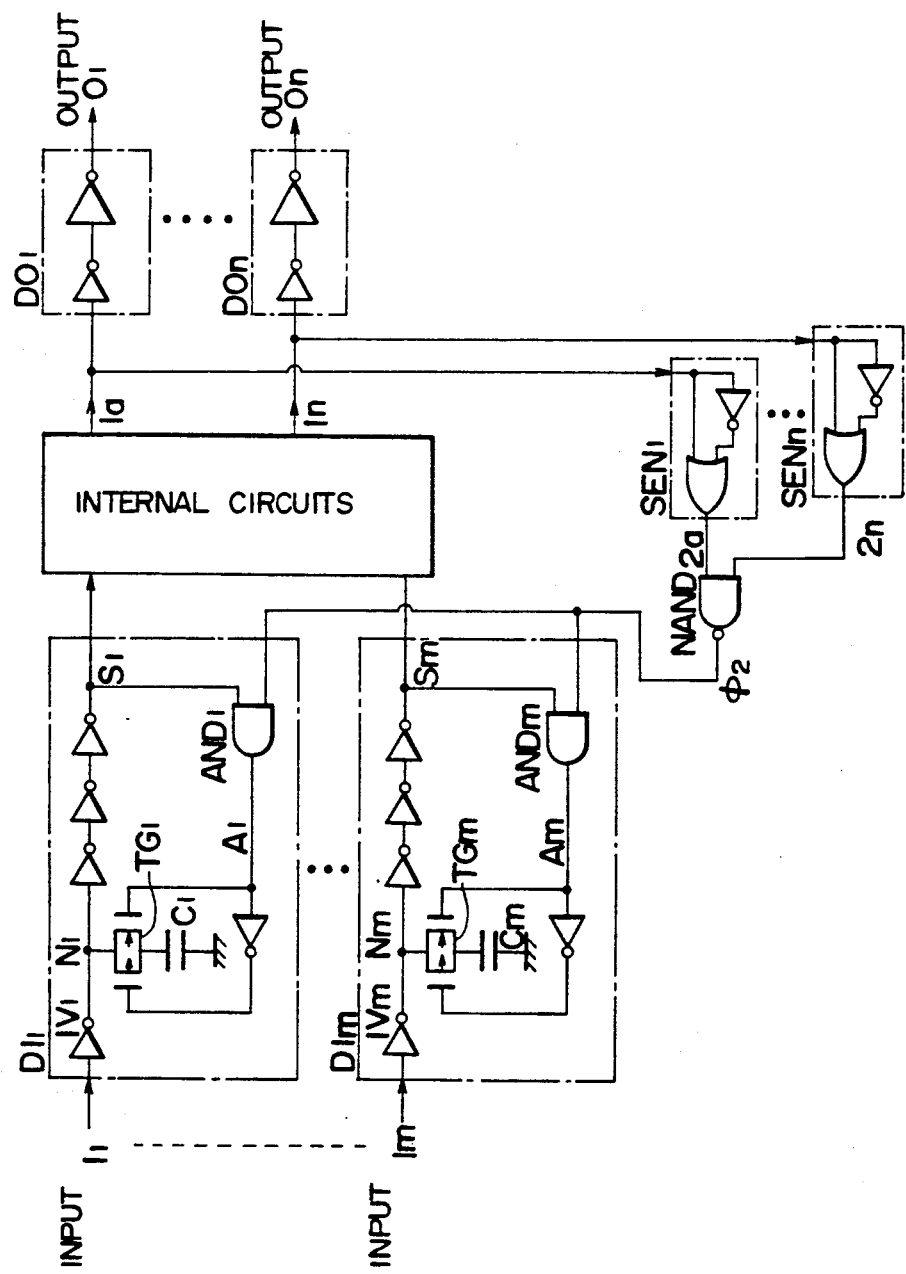
FIG. 1 is a circuit diagram illustrating a noise absorbing circuit suitable for semiconductor integrated circuits according to an embodiment of the present invention.
Figure 2:
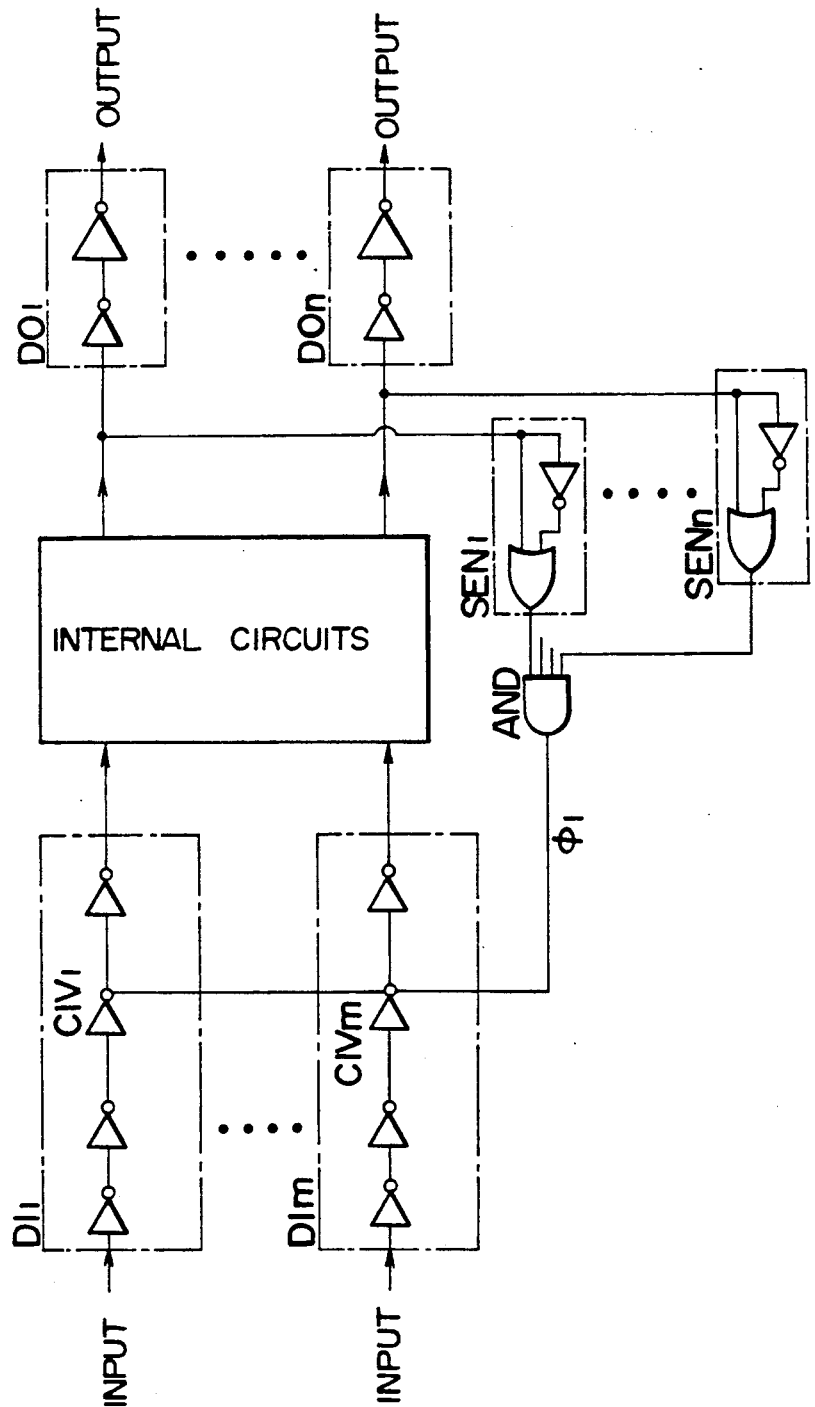
FIG. 2 is a circuit diagram illustrating a conventional circuit for protecting an input circuit against output noise.

Referring to FIG. 1 which shows one embodiment of the present invention, the semiconductor integrated noise absorbing circuit is composed of input buffer circuits $DI_l$ to $DI_m$, output buffer circuits $DO_l$ to $DO_n$, output change detecting circuits $SEN_l$ to $SEN_n$, and a NAND gate NAND.

Inverters $IV_l$ to $IV_m$ are connected to the inputs of the input buffer circuits $DI_l$ to $DI_n$, respectively. Further, input signal lines $I_l$ to $I_m$ are connected to the inputs of the inverters $IV_l$ to $IV_m$, respectively. The inverters $IV_l$ to $IV_m$ have the outputs $N_l$ to $N_m$ connected to load capacitors $C_l$ to $C_m$ through transfer gates $TG_1$ to $TG_m$ respectively, and connected to internal circuits by way of a plurality of inverter circuits.

The input level detecting AND gate circuits $AND_1$ to $AND_m$ receive output signals $S_1$ to $S_m$ respectively from the input buffer circuits $DI_1$ to $DI_m$ and each receive the output signal $\phi_2$ from the NAND gate circuit, and output gate control signals $A_1$ to $A_m$ to turn on or off the transfer gate circuits $TG_1$ to $TG_m$ respectively. When the gate control signals $A_1$ to $A_m$ are at "H" logic level, the transfer gates $TG_1$ to $TG_m$ respectively are turned on.

Meanwhile, signals $1_a$ to $1_n$ are input to the output buffer circuits $DO_1$ to $DO_n$ and to the output change detecting circuits $SEN_1$ to $SEN_n$. The output signals $2_a$ to $2_n$ of the circuits $SEN_1$ to $SEN_n$ are delivered to the NAND gate circuit. The NAND gate circuit delivers the output signal $\phi_2$ to the input level detecting AND gate circuits $AND_1$ to $AND_m$ in the input buffer circuits $DI_1$ to $DI_m$ respectively.

Explanation of the operation of the embodiment arranged as described will be set forth below.

The output change detecting circuits $SEN_1$ to $SEN_n$ receive the signals $1_a$ to $1_n$ transmitted to the output buffer circuits $DO_1$ to $DO_n$ respectively to detect a change in output level from "H" to "L" of any one of the output buffer circuits $DO_1$ to $DO_n$. When at least one of the detection signal $2_a$ to $2_n$ transmitted from the output buffer circuits is turned to "L", the control signal $\phi_2$ delivered from the NAND gate circuit NAND is turned into "H". At this time, when the input buffer circuits $DI_1$ to $DI_m$ receive input signal lines I at "H", the corresponding AND gate circuits AND deliver output signals A at "H" level. Accordingly, the output signals A from the AND gate circuits AND turn on the transfer gates TG so that the load capacitors C are connected to the input signal lines in the input buffer circuits DI. When a load capacitance is connected to the input signal lines, noise which is produced by an increase in the potential level of the ground line due to a change in output level of the output buffer circuits and which is added to "H" level on the input signal lines can be absorbed.

The noise absorbing circuit in this embodiment can absorb noise as mentioned above. Thus, when the input signal line I is high, the transfer gate circuit TG turns on only when at least one of the output buffer circuits $DO_1$ to $DO_n$ is changing its level from "H" to "L". In such a case that all output buffer circuits change the level from "L" to "H" and the input signal lines is at "H" level, the input signal transmission speed is not lowered. Accordingly, noise can be effectively suppressed without producing an undesired delay in the signal supply to the internal circuits.

Further, since, as mentioned above, the signal supplying operation to the internal circuits is not interrupted, no internal signal level holding circuit is required. Accordingly, the circuit arrangement of the present invention can be simplified compared to the prior art.

As mentioned above, according to the present invention, each of the input buffer circuits includes a load capacitor connected to an input signal line through a gate circuit. The above-mentioned gates are opened if the level of the input signal lines is high when the signal level of the output buffer circuits change from a high level to a low level. Accordingly, noise produced on the input signal can be absorbed by the load capacitor, whereby it is possible to effectively prevent the internal circuits from malfunctioning due to the noise. Further, since the above-mentioned signal line is not connected to the load capacitor when the signal line is at a low voltage level, it is possible to eliminate such a disadvantage of the speed of signal supply being lowered. Moreover, since the internal circuits can be prevented without ceasing the signal supplying operation to the internal circuits, the internal signal level holding circuit can be eliminated, whereby it is possible to simplify the circuit arrangement.

What we claim is:

1. A noise absorbing circuit comprising:
   an output variation detecting circuit for detecting a variation in an output signal level of an output buffer circuit which changes from a high level to a low level;
   an input level detecting circuit for detecting such a condition that an input signal line has a high voltage level;
   a capacitor connected to said input signal line; and
   a gate circuit connected between said capacitor and said input signal line; said gate circuit being closed so as to connect said capacitor to said input signal line if the voltage level of said input signal line is high when the output level of said output buffer circuit changes from a high level to a low level.

2. A semiconductor integrated circuit comprising:
   an input buffer circuit having an input signal line and an input terminal coupled to the input signal line;
   an output buffer circuit having an output terminal;
   a first detecting circuit for detecting that said output buffer circuit has outputted a low level signal from the output terminal thereof in place of a high level signal, said first detecting circuit generating a first signal upon the low level signal being detected thereby;
   a second detecting circuit for detecting that the input terminal of said input buffer circuit receives a high level signal, said second detecting circuit generating a second signal upon the high level signal being detected at the input terminal and the first signal being generated;
   a capacitor having a first terminal and a second terminal, the first terminal being grounded; and
   gating means for coupling the second terminal to the input signal line, said gating means connecting the second terminal to the input signal line upon the second signal being detected.

3. A circuit according to claim 2, wherein said second detecting circuit includes an AND circuit.

4. A circuit according to claim 3, wherein said gating means includes a transistor having a first electrode, a second electrode, and a control electrode, the control electrode being connected to the output terminal of the AND circuit, the first electrode and the second electrode being respectively connected to the second terminal of said capacitor and the input signal line.

5. A semiconductor integrated circuit comprising:
   a first detecting circuit generating a first detection signal when voltage noise is produced within the semiconductor integrated circuit;
   a first circuit having a first input node and a first output node, the first circuit receiving a first input signal at the first input node thereof and outputting a first output signal from the first output node thereof in response to the first input signal;
   a second circuit coupled to the first output node, and having a second output node, the second circuit receiving the first output signal from the first output node and outputting a second output signal from the second output node thereof in response to the first output signal;

a capacitor coupled to the first output node; and a transistor coupling said capacitor to said first output node in response to said first detection signal.

6. The circuit according to claim 5, further comprising:

an output terminal; and an output buffer circuit outputting a third output signal from said output terminal;

wherein said first detecting circuit generates the first detection signal upon detecting a change in the magnitude of the third output signal.

7. The circuit according to claim 6 wherein said first detecting circuit generates the first detection signal upon detecting a change in magnitude of the third output signal from a high level to a low level.

8. The circuit according to claim 5 wherein said first and second circuits are included in an input buffer having an input terminal, the input terminal being connected to the first input node.

9. The circuit according to claim 8, further comprising:

an output buffer circuit including an output terminal coupled to output a third output signal;

wherein said first detecting circuit generates the first detection signal upon detecting a change in the magnitude of the third output signal.

10. The circuit according to claim 9 wherein said first detecting circuit generates the first detection signal upon detecting a change in the magnitude of the third output signal from a high level to a low level.

11. The circuit according to claim 10 further comprising a second detecting circuit generating a second detection signal upon detecting that the high level signal has been applied to the input terminal when the first detection signal is generated.

12. The circuit according to claim 11 wherein said transistor connects said capacitor with the first output node in response to the second detection signal.

13. A semiconductor integrated circuit comprising:

a first detecting circuit generating a first detection signal when voltage noise is produced within the semiconductor integrated circuit;

a first circuit having a first input node and a first output node, said first circuit receiving a first input signal at the first input node and outputting a first output signal from the first output node in response to the first input signal;

a second circuit, coupled to the first output node and having a second output node, the second circuit receiving the first output signal from the first output node and outputting a second output signal from the second output node in response to the first output signal;

a capacitor coupled to the first output node, said capacitor having first and second electrodes, the first electrode of said capacitor being grounded; and a transistor, having a gate electrode, to couple the second electrode of said capacitor with the first output node in response to the first detection signal.

14. The circuit according to claim 13 wherein said first detecting circuit generates the first detection signal upon detecting a change in the magnitude of the third output signal from a high level to a low level.

15. The circuit according to claim 13 wherein said first and second circuits are included in an input buffer circuit having an input terminal which is connected to the first input node.

16. The circuit according to claim 15 wherein said first detecting circuit generates the first detection signal upon detecting a change in the magnitude of the third output signal from a high level to a low level.

17. The circuit according to claim 16 further comprising a second detecting circuit generating a second detection signal upon detecting that the high level signal has been applied to the input terminal when the first detection signal is generated.

18. The circuit according to claim 17 wherein said transistor connects said capacitor with the first output node upon the second detection signal being received at the gate electrode of said transistor.

* * * * *